(12) United States Patent
Snider

(10) Patent No.: US 7,609,530 B2
(45) Date of Patent: Oct. 27, 2009

(54) CONDUCTIVE ELASTOMERIC SHIELDING DEVICE AND METHOD OF FORMING SAME

(75) Inventor: Chris R. Snider, Noblesville, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 11/983,248

(22) Filed: Nov. 8, 2007

(65) Prior Publication Data

US 2009/0122507 A1      May 14, 2009

(51) Int. Cl.
*H05K 9/00* (2006.01)
(52) U.S. Cl. ............ 361/816; 361/800; 361/818; 174/350; 439/607.01
(58) Field of Classification Search .......... 361/800, 361/816, 818, 753, 799; 174/350, 354, 362, 174/377, 371, 385; 439/607.01, 607.03, 439/607.35, 607.13
See application file for complete search history.

(56) References Cited

U.S. PATENT DOCUMENTS 5,373,101 A   12/1994   Barabolak
5,550,713 A * 8/1996   Pressler et al. .............. 361/818
6,144,557 A * 11/2000  Chen et al. .................. 361/704

FOREIGN PATENT DOCUMENTS

DE    19736208    12/1998
WO    0243456     5/2002

OTHER PUBLICATIONS

European Search Report dated Mar. 23, 2009.
European Search Report dated Jul. 21, 2009.

* cited by examiner

*Primary Examiner*—Dameon E Levi
(74) *Attorney, Agent, or Firm*—Jimmy L. Funke

(57) ABSTRACT

A conductive elastomeric shielding device (400) for use with an electronic device includes a raised surface (401) and a sidewall (405) formed with the raised surface (401). A turret section (406) is formed with the sidewall (405) where an engagement member (407) projects from the turret section (406) for frictional engagement with an aperture (408) in a printed circuit (PC) board (410). The raised surface and sidewall are manufactured of an elastomeric shielding material for shielding radio frequency (RF) radiation for electronic components used therewith.

20 Claims, 6 Drawing Sheets

CONDUCTIVE ELASTOMERIC SHIELDING DEVICE AND METHOD OF FORMING SAME

FIELD OF THE INVENTION

The present invention relates generally to electronic shielding and more particularly to a removable and reusable radio frequency (RF) shield.

BACKGROUND OF THE INVENTION

Circuit board microprocessors often require some form of protection from radiated RF emissions that may be in proximity to their location. Typically, this has been accomplished by providing a thin metallic box or lid style cover that is soldered to a printed circuit (PC) board over one or more electronic components that require the shielding. As best seen in prior art FIG. 1, the shield 100 generally includes tabs 101, 103, spaced at intervals, such that the tabs are positioned into slots located in the circuit board. Each shield generally uses several twist style tabs 105 that are soldered to a PC board (not shown). These tabs work to prevent any long gaps between the bottom of the shield and the PC board since any gaps may allow penetration of RF energy into the protected area. Thus, even with the development of the metallic shielding system, each shield must be individually configured to reduce the probability of any leakage into the protected area for eliminating these types of gaps.

In use, the shield 100 requires insertion into slots/holes in the PC board where, if not locked in place, can raise above the PC board during the soldering process. In cases where repair or inspection of the shielded electrical components are required, the shield must be de-soldered and removed to allow access to that area of the PC board assembly. The current solution for this situation is a metal frame sometimes referred to as a "fence" that is soldered to the PC board with a snap-on type lid. However, in this configuration, two component parts are required to form the shield assembly. Although somewhat effective, this type of shielding arrangement can significantly increase component and production costs to the extent they may be only be used only in specialized shielding situations.

In addition, during the repair process, these types of snap-on lids are typically discarded and a new lid is installed in order to prevent problems with the lid coming loose thereby creating a mechanical rattle. As seen in prior art FIG. 2, the fence 200 includes a cross bar style support 201, 203, which must be mechanically snipped away if a repair is required prior to the installation of a new lid. This type of fence 200 further includes a plurality of engagement slots 205, 207 as well as a plurality of projections 209, 211 that engage with the PC board to hold the fence into position. One or more twist tabs 213 are also used to provide a firm mechanical connection to portions of the PC board. Hence, as current PC board assemblies migrate to primarily surface-mount devices (SMDs), these types of RF shield assemblies also must adapt to this process. Although some shielding solutions have been developed strictly for surface-mount processing, these solutions have issues relative to providing an adequate seal against the circuit board in view of component size limitations.

Any type of RF shield is used in connection with outside connector-type devices used on the PC board. Shields that are designed for covering or providing a hood, are often referred to as a "dog house" shield and are used for isolating the pins of a connector body that provide external connections to the outside devices. The necessity for added holes in the PC board and the typical assembly techniques employed to attach the shield components with twist tabs prior to the solder operation adds expensive assembly time and limits the application to a leaded style component parts. Additionally, these types of connector shields utilize fastening screws to mechanically provide a strain relief for the connector as well as enabling a adequate electrical ground. Thus, shields of this type also add a great deal of operational cost in view of these complex assembly requirements.

Moreover, as seen in prior art FIGS. 3A and 3B, some types of connector shields also incorporate ground features that include additional shielding added through a weld or fastening operation for providing a compression contact to a case or chassis. FIG. 3A illustrates a perspective view of connector shield 300 having a frame 301 that includes a ground slot 303 for insertion of a grounding member (not shown) that provides an electrical ground. A grounding tab 305 and fastening tab 307 are also used to hold the connector shield to a PC board or the like. Similarly, FIG. 3B also illustrates a perspective view of an alternative bracket similar to that in FIG. 3A, where a frame 309 includes a ground spring 311 for making ground contract with a metallic object and one or more twist tabs 313 for grounding the frame 309 to a PC board. Those skilled in the art will recognize that any wide gaps in a case and/or chassis can be a potential problem for RF emissions, such that metallic foils and metal tapes are also applied to these types of connectors in order to isolate a port from any radiated RF emissions. In that these types of shields are inadequate for shielding electrical components from RF energy, a new type of shield is required for these applications.

These and other features, advantages, and objects of the present invention will be further understood and appreciated by those skilled in the art by reference to the following specification, claims, and appended drawings.

BRIEF DESCRIPTION OF THE DRAWINGS FIGURES

The present invention will now be described, by way of example, with reference to the accompanying drawings, in which.

Figure 1:
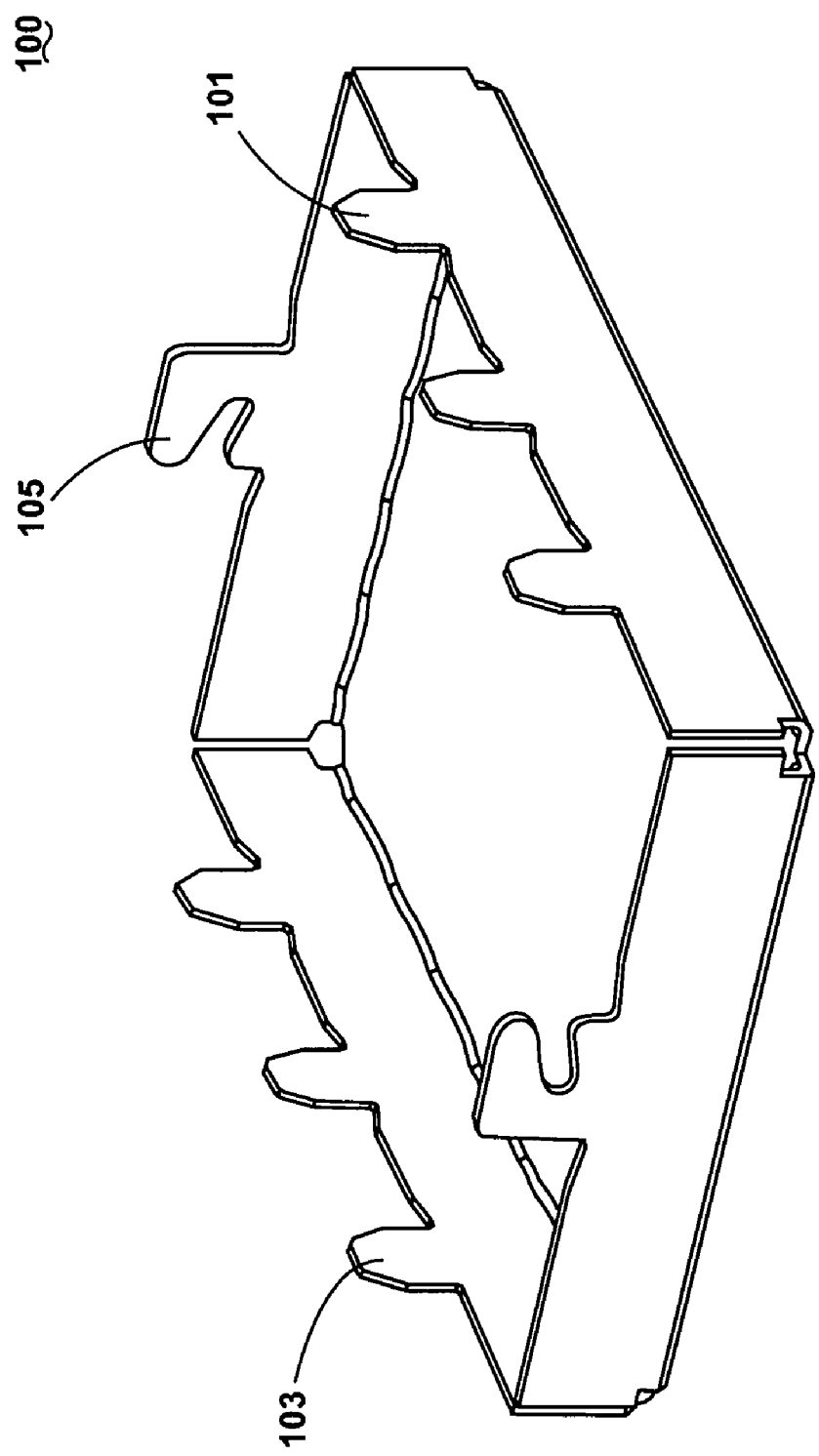
FIG. 1 is a perspective view of a shield cover as used in the prior art.
Figure 2:
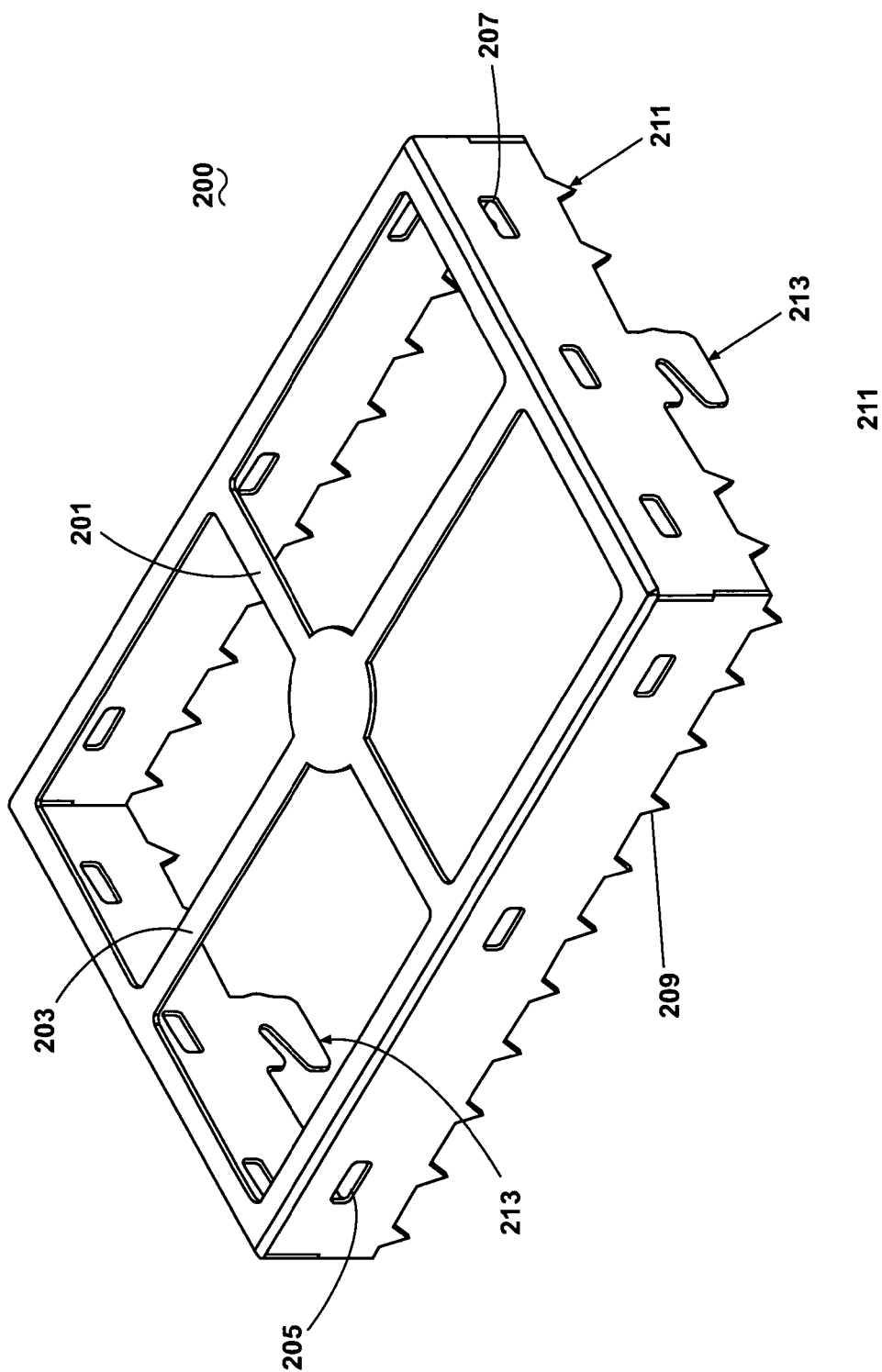
FIG. 2 is a prior art diagram of the metal frame as used in the prior art.
Figure 3B:
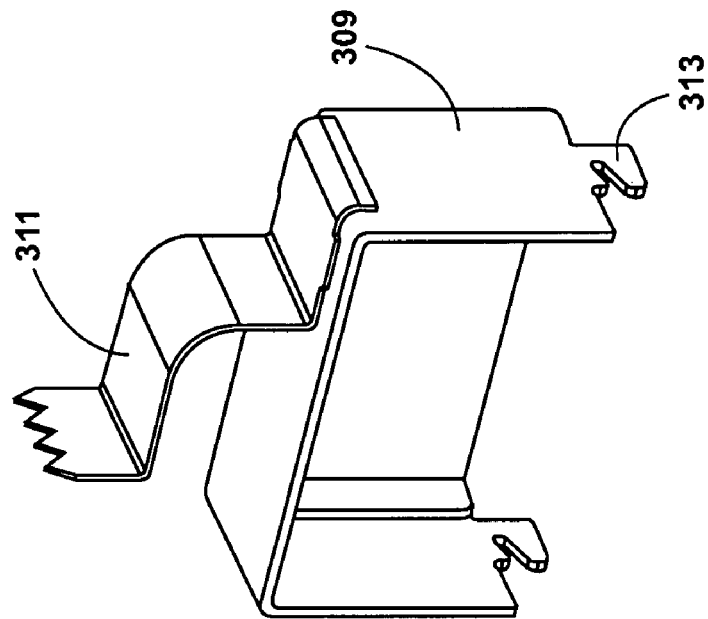
FIGS. 3A and 3B are perspective view of connector shield used in the prior art.
Figure 3A:
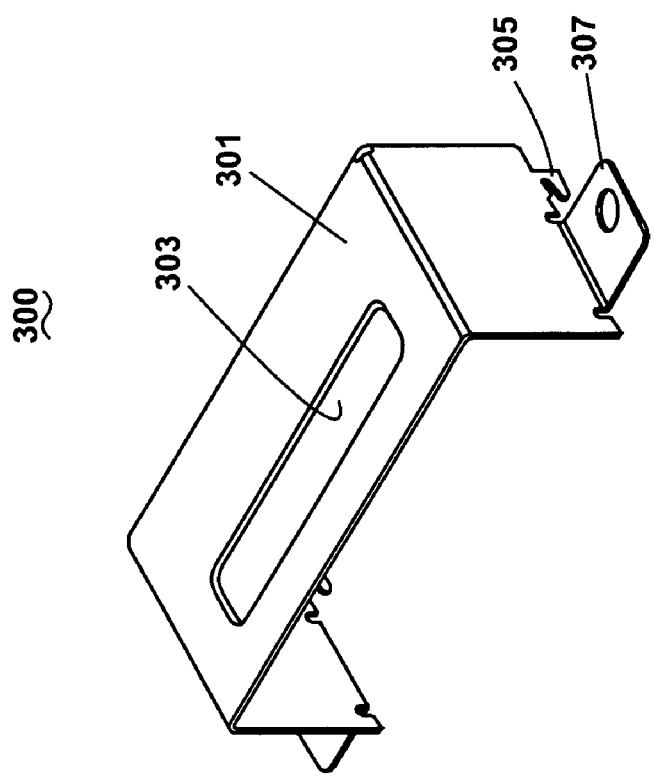
Figure 4A:
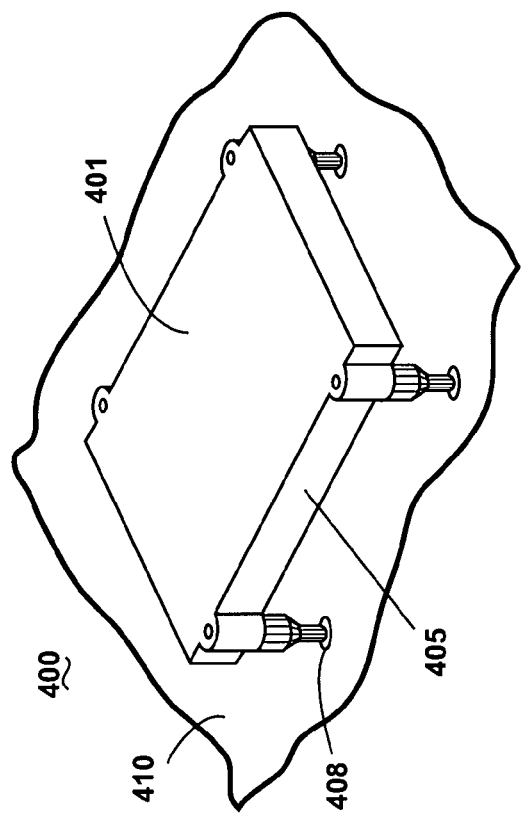
Figure 4B:
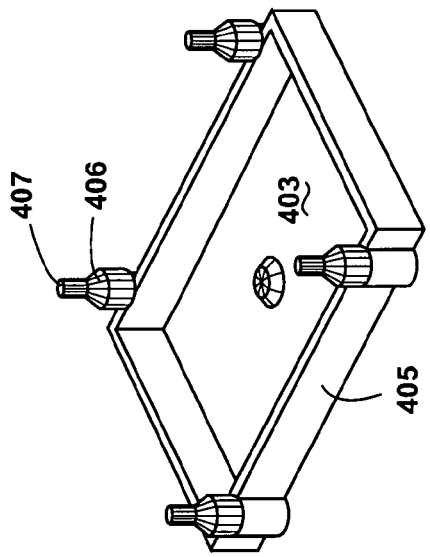
Figure 4C:
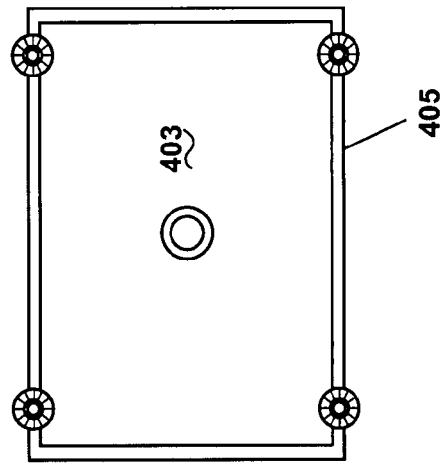
Figure 4D:
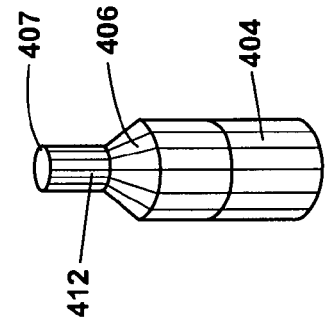
Figure 5A:
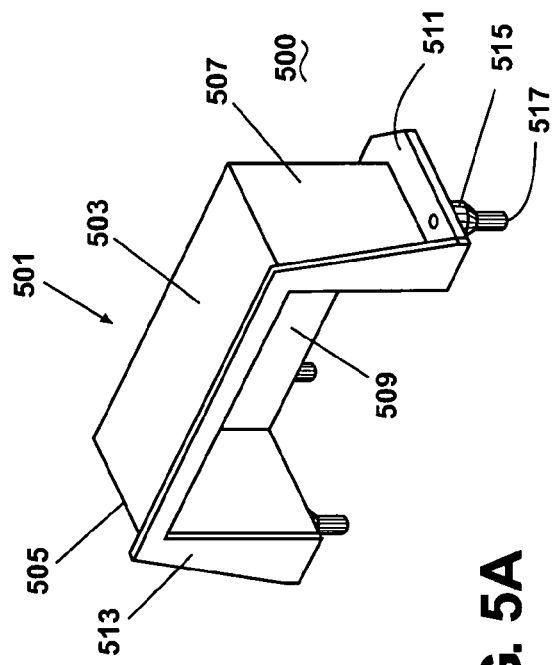
Figure 5D:
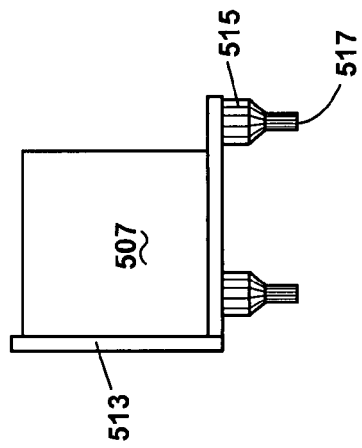
Figure 5C:
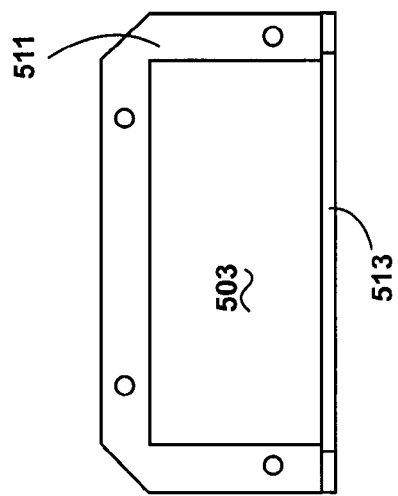
Figure 5B:
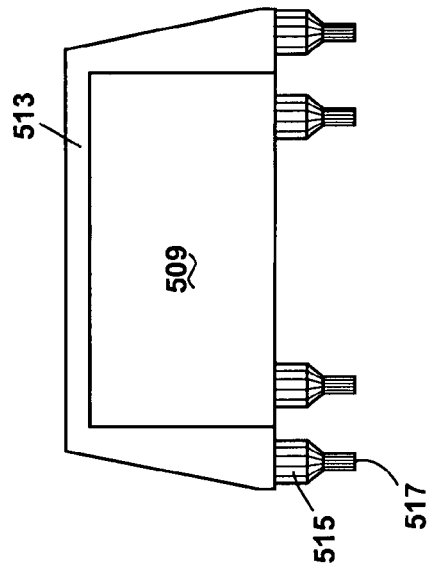
Figure 6:
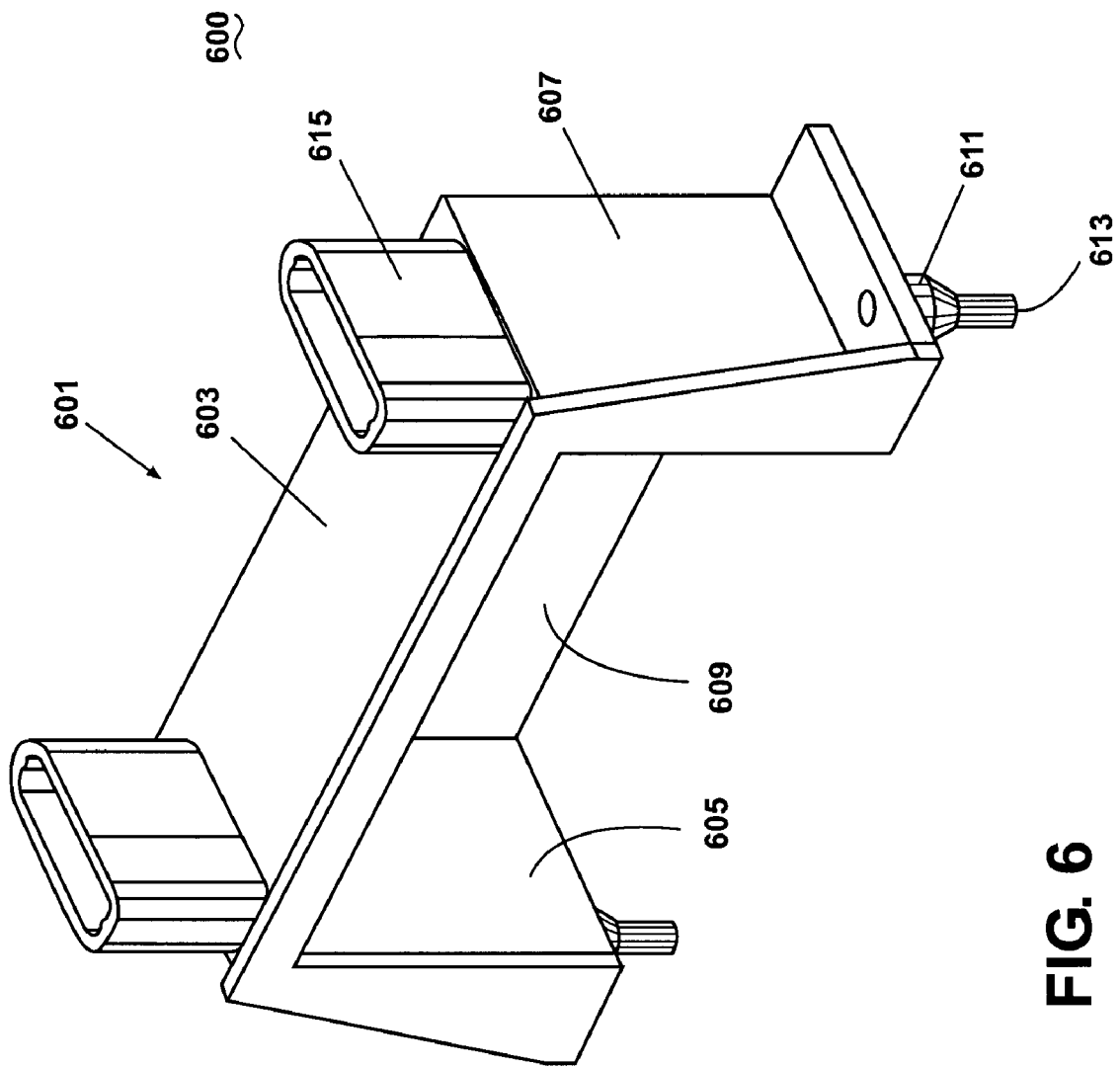

FIGS. 4A, 4B, 4C, and 4D illustrate a perspective view of the top of the elastomeric shield, bottom of the electrometric shield, top view of the elastomeric shield, and magnified view of the circular turret section, respectively, in accordance with some embodiments of the invention;

FIGS. 5A, 5B, 5C, and 5D illustrate a perspective view, a front view, a top view, and a side view, respectively, of a connector shield as used in accordance with an alternative embodiment of the invention; and FIG. 6 illustrates a perspective view of a connector shield having an attached ground contact in accordance with an alternative embodiment of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DESCRIPTION OF INVENTION

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

Before describing in detail embodiments that are in accordance with the present invention, it should be observed that the embodiments reside primarily in combinations of method steps and apparatus components related to an elastomeric shield. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

FIGS. 4A, 4B, 4C, and 4D illustrate a perspective view of the top of the elastomeric shield, a perspective view of the bottom of the elastomeric shield, a bottom plan view of the elastomeric shield, and a magnified view of the circular turret section, respectively, in accordance with an embodiment of the invention. In order to overcome the manufacturing issues associated with prior art shielding designs, an elastomeric shield 400 incorporates an electrically conductive elastomeric material molded directly into the shield 400 in a manner such that the shield can be configured into any desired shape. Although shown in FIGS. 4A, 4B, and 4C as a square configuration, it should be evident that any other shape or size of shield is possible such as rounded, triangular, or rectangular configurations. The shield 400 includes a top section 401, underside section 403, and edge sections 405. At each corner of the shield 400, a circular turret section 406 is used to hold a frictional engagement member 407. The engagement member 407 is oriented on the turret section 407 such that it projects away from the underside section 403 using a base 404. The surface of the engagement member 407 may also include ridges, bumps, hooks, and/or other means 412 for enabling the engagement member 407 to be frictionally retained within a corresponding aperture 408 on a PC board 410. Thus, the shield 400 is molded such that it forms an interface with one or more select holes through the PC board 408. This configuration allows either a push-through, pull-through, or a push/pull retention with the engagement member 407.

The elastomeric material used in the shield 400 can be manufactured of many varieties of silicone rubber or other non-conductive pliable material.

Moreover, the electrical mu-metal fillers combined with the silicone rubber might include but is not limited to Silver (Ag), Silver/Copper (Ag/Cu), Silver/Nickel (Ag/Ni), Nickel/Graphite (Ni/Graphite), or the like. The advantages of the elastomeric material over the sheet metal or metalized plastic is that it is more compliant to variations in the surface of the board allowing for a better seal against a contact runner (not shown). Methods for securing the molded shield to the circuit board, will not require soldering, making it ideal for any surface mount process or stick lead during assembly. Another advantage with an elastomeric component shield is that it greatly reduces any chance for noise, such as a mechanical rattle, that is often present when utilizing sheet metal shields. This may stem from the component, as in the cover on a soldered-style perimeter wall, or from an adjacent component, such as a ziff-style cable connector, that may vibrate against metal. For a connector shield application, the molded shield eliminates the need for assembly prior to soldering as well as any twisting tabs or other mechanical fasteners in order to fasten the shield into position.

FIGS. 5A, 5B, 5C, and 5D illustrate a perspective view, a front view, a top view, and a side view, respectively, of a connector shield as used in accordance with an alternative embodiment of the invention. Those skilled in the art will recognize that when using an elastomeric base material, it may be configured into the shape of a connector port seal which eliminates any need to provide additional RF seal components. As seen in FIGS. 5A, 5B, 5C, and 5D, the connector shield 500 includes a housing 501 that forms a partial enclosure with a PC board (not shown). The housing 501 includes a top 503, sides 505, 507, and a back 509. A skirt 511 is positioned about the lower perimeter of the sides 505, 507 and back 509. The skirt 511 is used to form a tighter RF seal with the PC board 510. An upper flange 513 extends across the upper edge of the housing 501 in order to provide an RF seal with an electrical connector (not shown), which can be placed within the housing 501. As noted in FIGS. 4A, 4B, and 4C, the shield 500 further includes one or more turrets 515 each having an engagement member 517 for frictional engagement within an associated aperture in the PC board. When access to the connector assembly is required, the shield 500 can be easily removed by providing an upward or pulling force to remove either engagement member(s) 517 from their respective apertures.

FIG. 6 illustrates a perspective view of a connector shield having an attached ground contact in accordance with an alternative embodiment of the invention. In this embodiment, the shield 600 includes a housing 601 that comprises a top 603, sides 605, 607, and back 609. One or more turrets 611 and associated respective engagement member 613 are used for holding the shield into an aperture on a PC board. The shield 600 also includes a resilient ground stub 615 for allowing the shield to make electrical contact with a chassis ground or the like. Thus, the resiliency of the grounding stub 615 can be designed to provide a ground to the case or chassis by a compression contact for eliminating screws or other types of mechanical fasteners. Those skilled in the art will further recognize that the grounding stub 615 eliminates a need for twist tabs or specialized tools used in the manufacturing process. The grounding stub 615 can be incorporated as part of the shield design in any plane that is needed to contact a case or chassis surface. This provides the capability to incorporate a dual shield in the event two circuit boards are oriented either in parallel, allowing a shield "sandwich-like"

configuration or, if perpendicular, a right-angled style of interface that can be positioned to maximize the shielding potential from a single part.

The nature and properties of the elastomeric material also allow for a tight RF seal of any electromagnetic charge (EMC) that provides a portal that may sometimes be needed for certain types of electrical enclosures. Another advantage to the elastomeric shield of the present invention is that it can be attached to another electrical or mechanical component other than a printed circuit board while still providing the necessary shielding functionality to desired components. For example, due to the nature of the elastomeric material, the push/pull nature of the engagement member can be used on a cover such that when the cover is attached to the assembly, the elastomeric shield may include one or more ribs that seal against a printed circuit board on a ground runner. Additionally, any interface enclosure gaps can be easily sealed due to the pliable nature of the elastomeric material. Multiple shields and/or shield assemblies with ground springs can also be replaced with a single mounted elastomeric shield.

Still yet another embodiment of the invention includes a method for spraying the inside of the elastomeric housing with a metalized coating or with a vacuum metalized process to provide a thin layer conductive shield. Also, a foil coating can be applied to the underside of an elastomeric body. This allows the elastomeric properties of the invention to fulfill the structure and retention capabilities of the shield for enabling the conductive part to provide the metalized shielding. Additionally, the elastomeric shield can be molded in a matrix or sheet to maximize processing and handling efficiency. The characteristics of the elastomeric material allows for grooving with thin, tear-away sections allowing individual switch pads to be ripped or torn from a large sheet of shield devices segmented into individual sections.

Thus, the present invention is directed to an elastomeric shield for use in shielding radio frequency (RF) energy that includes at least one conductive elastomeric cover having a plurality of elastomeric sidewalls surrounding the cover. One or more turrets are formed with the plurality of sidewalls for holding an engagement member where the engagement member operates to removably hold the conductive elastomeric shield into a fixed position on a printed circuit (PC) board.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

The invention claimed is:

1. A conductive elastomeric shielding device for use with an electronic device comprising:
   at least one raised surface;
   at least one sidewall formed with the at least one raised surface;
   at least one turret section integrally formed on an exterior surface of the at least one sidewall;
   an engagement member projecting from the at least one turret section for engagement with an aperture in a printed circuit (PC) board; and
   wherein the at least one raised surface and the at least one sidewall are made of a conductive elastomeric shielding material for shielding radio frequency (RF) radiation while enabling the conductive elastomeric shielding device to be removed without damage.

2. A shielding device as in claim 1, wherein the engagement member includes a plurality of ridged edges for holding the at least one engagement member in the aperture.

3. A shielding device as in claim 1, wherein the engagement member is made of an elastomeric material for grounding the shield to the PC board.

4. A shielding device as in claim 1, further comprising a skirt formed with the at least one sidewall to provide a substantially tight RF seal with the PC board.

5. A shielding device as in claim 1, further comprising an upper flange for provide contact with an electrical connector.

6. A shielding device as in claim 1, further comprising a resilient grounding stub for making electrical contact with a metallic housing.

7. An elastomeric shield for use in shielding radio frequency (RF) energy comprising:
   at least one conductive elastomeric cover having a plurality of elastomeric sidewalls surrounding the cover;
   at least one turret section integrally formed with an exterior surface the plurality of sidewalls for holding an engagement member; and
   wherein the engagement member operates to removably hold the conductive elastomeric shield into a fixed position on a printed circuit (PC) board so that it may be removed without damage.

8. An elastomeric shield as in claim 7, wherein the engagement member is a conductive elastomeric material for grounding the conductive elastomeric cover to the PC board.

9. An elastomeric shield as in claim 7, wherein a plurality of engagement members substantially surround the perimeter of the elastomeric cover.

10. An elastomeric shield as in claim 7, wherein the engagement member includes a plurality of ridged edges for holding the engagement member into a fixed position with an aperture in the PC board.

11. An elastomeric shield as in claim 7, further comprising a skirt formed with the plurality of sidewalls for providing an RF seal against the PC board.

12. An elastomeric shield as in claim 7, further comprising an upper flange formed with the top of the shield for providing an RF seal with an electrical connector.

13. An elastomeric shield as in claim 7, further comprising a resilient grounding stub for making electrical contact with a metallic housing.

14. An elastomeric shield as in claim 7, wherein the resilient grounding stub is located on the at least one elastomeric cover.

15. A method for forming a conductive elastomeric shield for shielding radio frequency (RF) energy comprising the steps of:
   forming an elastomeric top section that is electrically conductive;
   forming a plurality of elastomeric sidewalls connected with the top section that are electrically conductive;
   forming a turret section integrally with an exterior surface of the plurality of elastomeric sidewalls; and
   extending an engagement member from the turret section such that the engagement member works to hold the shield in a fixed position on a printed circuit (PC) board while allowing the conductive elastomeric shield to be removed without damage.

16. A method for forming a conductive elastomeric shield as in claim 15, further comprising the step of:
forming the engagement member into an conductive elastomeric material allowing the engagement member to ground the top section and sidewalls to a printed circuit (PC) board.

17. A method for forming a conductive elastomeric shield as in claim 15, further comprising the step of:
forming a skirt around the perimeter of the sidewalls for providing a substantially tight RF seal.

18. A method for forming a conductive elastomeric shield as in claim 15, further comprising the step of:
forming a flange along an upper edge of the top section for proving an RF seal with an electrical conductor.

19. A method for forming a conductive elastomeric shield as in claim 15, further comprising the step of:
forming a resilient grounding stub connected to the elastomeric top section for making electrical contact with a metallic housing.

20. A method for forming a conductive elastomeric shield as in claim 15, further comprising the step of:
forming a plurality of ridged edges into the engagement member for holding the at least one engagement member in the aperture located in the printed circuit (PC) board.

* * * * *